(12) United States Patent
Morii et al.

(10) Patent No.: US 7,488,506 B2
(45) Date of Patent: *Feb. 10, 2009

(54) ORGANIC ELECTRO-LUMINESCENT DEVICE, MANUFACTURING METHOD FOR THE SAME, AND ELECTRONIC EQUIPMENT

(75) Inventors: Katsuyuki Morii, Suwa (JP); Shunichi Seki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/907,219

(22) Filed: Oct. 10, 2007

(65) Prior Publication Data

US 2008/0107823 A1    May 8, 2008

Related U.S. Application Data

(63) Continuation of application No. 09/994,816, filed on Nov. 28, 2001, now Pat. No. 7,300,686.

(30) Foreign Application Priority Data

Nov. 28, 2000 (JP) ............................. 2000-361559
Nov. 19, 2001 (JP) ............................. 2001-353682

(51) Int. Cl.
*B05D 5/06* (2006.01)
(52) U.S. Cl. ................ 427/66; 427/256; 427/68; 427/384; 427/421.1
(58) Field of Classification Search ............. 427/256, 427/68, 384, 66, 421.1
See application file for complete search history.

(56) References Cited

U.S. PATENT DOCUMENTS 3,796,930 A    3/1974    Page
5,331,344 A *  7/1994   Miyagawa et al. ............ 347/65
5,921,836 A    7/1999    Nanto et al.
6,114,805 A    9/2000    Codama et al.
6,127,004 A *  10/2000  Hatwar et al. ................ 427/535
6,174,613 B1   1/2001    Antoniadis et al.
6,403,236 B1   6/2002    Ohnishi et al.
6,447,934 B1   9/2002    Suzuki et al.
6,878,312 B1   4/2005    Kanbe et al.
7,273,637 B2 * 9/2007    Morii .......................... 427/256
2002/0109456 A1  8/2002   Morii et al.
2003/0054186 A1* 3/2003   Miyashita et al. ............ 428/500
2003/0132703 A1  7/2003    Sakaguchi

FOREIGN PATENT DOCUMENTS

EP    1 083 775 A1    3/2001

(Continued)

OTHER PUBLICATIONS

Tang, C.W. et al., "Organic electroluminescent diodes", *Appl. Phys. Lett.*, vol. 51, No. 12, Sep. 21, 1987, pp. 913-915.

Carter, J.C. et al., "Operating stability of light-emitting polymer diodes based on poly(*p*-phenylene vinylene)", *Appl. Phys. Lett.*, vol. 71, No. 1, Jul. 7, 1997, pp. 34-36.

(Continued)

*Primary Examiner*—Alain L Bashore
(74) *Attorney, Agent, or Firm*—Oliff & Berridge, PLC

(57) ABSTRACT

The present invention provides a manufacturing method for forming an organic electro-luminescent device by forming a homogeneous light emitting layer which does not incur the phase separation. The light emitting layer is formed by discharging ink compositions composed of at least two electroluminescent materials on the substrate following the order which starts with an ink composition which has the fewest number of organic electro-luminescent materials or which is most difficult to be phase separated.

10 Claims, 5 Drawing Sheets

FOREIGN PATENT DOCUMENTS

| | | |
|---|---|---|
| JP | A-7-235378 | 9/1995 |
| JP | A-10-12377 | 1/1998 |
| JP | A-10-153967 | 6/1998 |
| JP | A-11-40358 | 2/1999 |
| JP | A-11-54270 | 2/1999 |
| JP | A-11-339957 | 12/1999 |
| JP | A-2000-156291 | 6/2000 |
| JP | A-2001-291583 | 10/2001 |
| JP | A-2002-231447 | 8/2002 |
| WO | WO98/24271 | 6/1998 |
| WO | WO00/59267 | 10/2000 |

OTHER PUBLICATIONS

Gustafsson, G. et al., "Flexible light-emitting diodes made from soluble conducting polymers", *Nature*, vol. 357, Jun. 11, 1992, pp. 477-479.

\* cited by examiner

ORGANIC ELECTRO-LUMINESCENT DEVICE, MANUFACTURING METHOD FOR THE SAME, AND ELECTRONIC EQUIPMENT This is a Continuation of application Ser. No. 09/994,816 filed Nov. 28, 2001 now U.S. Pat. No. 7,300,686 issued Nov. 27, 2007. The disclosure of the prior application is hereby incorporated by reference herein in its entirety.

BACKGROUND OF THE INVENTION

1. Field of the Invention

The present invention relates to an organic electro-luminescent device provided with an electric light emitting elements used for displays, and display light sources, and the like, a manufacturing method for the same, and electronic equipment.

2. Background Art

Recently, the development of light emitting elements using organic materials for spontaneous light emitting-type displays in place of liquid crystal displays has been proceeding at a rapid pace. With respect to an organic electro-luminescent device equipped with a light emitting component using an organic material in the light emitting layer, a method for forming a low molecular weight layer using an evaporation process (disclosed from page 913 in Appl. Phys. Lett. 51 (12), 21 Sep. 1987), and a method for coating a large molecular weight layer (as disclosed from page 34 of Appl. Phys. Lett. 71 (1), July 1997) are principally known.

In the case of using a low molecular weight material as a means for coloring, a light emitting material differing from that of mask lifting is vapor deposited and formed onto the desired image. On the other hand, in the case of a large molecular weight material, much attention is being placed on performing the coloring using an ink jet method, due to refinement and ease with which the patterning can be accomplished. The following conventional examples are known as methods for forming an organic electro-luminescent component by means of such an ink jet method: Japanese Patent Application, First Publication No. Hei 7-235378, Japanese Patent Application, First Publication No. Hei 10-12377, Japanese Patent Application, First Publication No. Hei 10-153967, Japanese Patent Application, First Publication No. Hei 11-40358, Japanese Patent Application, First Publication No. Hei 11-54270, and Japanese Patent Application, First Publication No. Hei 11-339957.

In addition, from the standpoint of component manufacturing, in order to improve the light emitting efficiency and durability, the formation of an hole injection/transport layer between the electrode and light emitting layer is widely performed (disclosed from page 913 in Appl. Phys. Lett. 51 (12), 21 Sep. 1987). Hitherto, formation of a layer has been performed by means of a coating process such as spin coating or the like, using a conductive macromolecule as the buffer layer and/or hole injection/transport layer, e.g., a polythiophene derivative and/or polyaniline derivative (Nature, 357, 477, 1992). With respect to a low molecular weight material, formation of a layer using a phenylamine derivative, as the hole injection/transport layer, by means of evaporation has been reported.

The aforementioned ink jet methods are extremely effective as a means for simply forming a layer having a refined pattern without wasting the light emitting layer material comprising the organic electro-luminescent material.

When forming a light emitting layer using an organic electro-luminescent material according to an ink jet method, a composition is employed which comprises a solute and solvent, wherein the aforementioned solute comprises an organic electro-luminescent material.

As the aforementioned composition, it is possible to use a composition comprising only one type of organic electro-luminescent material, however, compositions comprising a plurality of organic electro-luminescent materials are more widely used. For example, by means of mixing a light emitting material and a fluorescent material, it is possible to change the light illuminated from the aforementioned light emitting material to a light having a different wavelength due to the presence of the aforementioned fluorescent material.

In this manner, in the case of a plurality of organic electro-luminescent materials, in order to obtain the desired light characteristics, it is necessary to form a layer in a state in which each of the aforementioned organic electro-luminescent materials is uniformly mixed without separation therefrom.

However, the droplets used in the formation of a thin layer according to the ink jet method are extremely small, and the evaporation time is short. As a result, the solvent molecules that are evaporated from the droplets are saturated prior to being sufficiently dispersed from the substrate area, such that even the resultant thin layer is re-dissolved. Furthermore, at the time of re-dissolving the aforementioned, the respective organic electro-luminescent materials phase separate from each other, which in turn results in problems, such as degradation of the performance characteristics of the organic electro-luminescent device.

SUMMARY OF THE INVENTION

The present invention was made to solve the above-described problems. The object of the present invention is to provide a manufacturing method, capable of forming a homogeneous luminescent layer which causes no phase separation during formation by the ink-jet method, and which is also capable of providing organic electro luminescence devices having superior display properties. In addition to the manufacturing method, an object of the present invention is to provide organic electro-luminescence devices having homogeneous luminescent layers and also having superior display properties. An object of the present invention also includes providing electronic equipment provided with the present organic electro-luminescent devices.

A first aspect of the present invention provides a manufacturing method for an organic electro-luminescent device comprising the steps of forming light emitting layers by discharging above a substrate at least two compositions each including at least one organic electro-luminescent material, the order of discharging said compositions above the substrate starting with a composition which has the fewest number of organic electro-luminescent materials.

It was observed that problems of the phase separation occur more easily with compositions comprising a larger number of organic electro-luminescent materials, and thus in the discharge formation of a layer, those compositions comprising a larger number of organic electro-luminescent materials are processed after the compositions comprising a fewer number of organic electro-luminescent materials. As a result, the aforementioned phase separation due to re-dissolution following completion of the discharge formation of the film can be prevented, and an organic electro-luminescence device possessing superior display properties can be reliably manufactured.

According to a second aspect of the present invention, the manufacturing method for an organic electro-luminescent device comprising the steps of forming light emitting layers by discharging above a substrate at least two compositions each including at least one organic electro-luminescent material, when discharging compositions which has the same number of organic electro-luminescent materials, the order of discharging said compositions above the substrate starting with a composition which is most difficult to be phase separated after the layer is formed.

According to the present invention, the organic electro-luminescent composition, which is liable to be phase separated after the film formation, is discharge formed after the discharge formation of the other organic electro-luminescent composition, which is difficult to be phase separated. Thus, it becomes possible to thereby prevent the phase separation due to re-dissolution after the discharge formation, which results in making it possible to provide a manufacturing method of organic electro-luminescent devices having superior display properties.

A third aspect of the present invention provides a manufacturing method for the organic electro-luminescent device, during two continuous cycles of discharging said compositions, the subsequent discharge of a composition being preferably performed after the droplets of the composition discharged in a first cycle are dried.

According to a fourth aspect of the present invention, the manufacturing method for an organic electro-luminescent device comprises the steps of forming said light emitting layer after forming steps of a plurality of first electrodes corresponding to a plurality of pixel regions, a bank layer for partitioning said plurality of pixel regions, a—hole injection/transport layer on said plurality of first electrodes on said first electrode, and the forming process further comprises the step of forming a second electrode on the light emitting layer.

Provision of banks makes it possible to perform the discharge formation of a layer by completely separating the two or more ink compositions into separate pixel regions. As a result, it is possible to easily maintain the independence of each light emitting layer, and thereby obtain an organic electro-luminescent device having superior display properties. In addition, a hole injection/transport layer is provided by means of which both a high luminescent efficiency and improved durability can be achieved.

Furthermore, the counter electrode comprises a cathode in the case when the image electrode is anode, and comprises an anode electrode in the case when the image electrode is cathode.

The organic electro-luminescent device of the present invention is obtained by means of using an aforementioned method for manufacturing an organic electro-luminescent device according to the present invention. It is possible to obtain an organic electro-luminescent device having a uniform light emitting layer and superior display properties.

The present invention also provides an electronic equipment provided with an organic electro-luminescent device produced by the above manufacturing process.

According to the present invention, it is possible to achieve electronic equipment that is equipped with a display apparatus having superior display properties.

BRIEF DESCRIPTION OF THE DRAWINGS

FIG. 9A shows the light emitting spectrum of a comparative example; and FIG. 9B shows the light emitting spectrum of an example.

DETAILED DESCRIPTION OF THE INVENTION

In the following, a manufacturing method for manufacturing an organic electro-luminescent device according to the present invention will be described with reference to FIGS. 1-7.

The manufacturing method according to the present embodiment comprises a bank formation process; a plasma treatment process; an hole injection/transport layer formation process; a surface reforming process; a light emitting layer formation process; a cathode formation process; and a sealing process.

Figure 1:
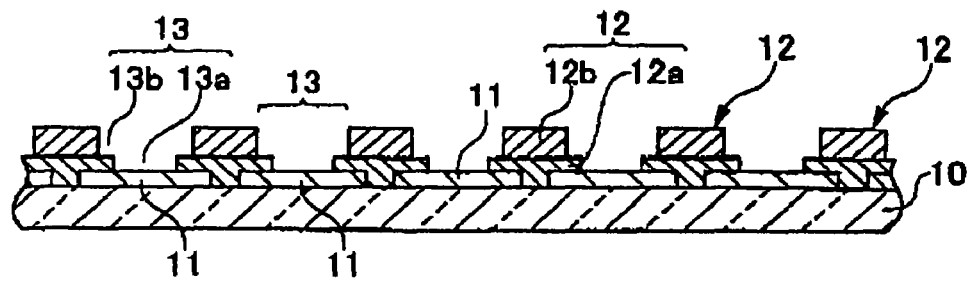
FIG. 1 is a cross sectional view showing a process of a manufacturing method for manufacturing an organic electro-luminescent device according to an embodiment of the present invention.

As shown in FIG. 1, according to the aforementioned bank formation process, bank layers 12 separating each pixel region are formed by means of sequentially layering an inorganic substance bank layer 12a and organic substance bank layer 12b on a transparent electrode 11 comprising ITO or the like, which is formed on a substrate 10 onto which TFT or the like (not shown in the Figures) has been pre-provided when necessary.

The aforementioned inorganic substance bank layer 12a may be formed by means of forming an inorganic layer of $SiO_2$, $TiO_2$, SiN, and the like on the entire surface of the substrate 10 and transparent electrode 11 according to, for example, a CVD process, a spattering process, an evaporation process, or the like; patterning the aforementioned inorganic layer using etching or the like; and then providing an opening 13a in the aforementioned transparent electrode 11. However, at this time, the inorganic substance bank layer 12a extends to the marginal areas of the transparent electrode 11.

Note that the layer thickness of the aforementioned inorganic substance bank layer 12a is preferably in the range of 50-200 nm, with a value of 150 nm being particularly preferred.

Subsequently, an organic substance bank layer 12b is formed on the entire surface of the substrate 10, transparent electrode 11, and inorganic substance bank layer 12a.

In addition, the organic substance bank layer 12b is formed by first dissolving a standard resist, e.g., acrylic resin, polyimide resin, or the like, in a solvent, and then coating this solution by means of spin coating, dip coating, or the like.

The organic substance bank layer 12b is then etched by means of a photolithography technique or the like to provide an opening 13b. This opening 13b of the aforementioned organic substance bank layer 12b is preferably formed slightly larger than the opening 13a of the inorganic substance bank layer 12a. In this manner, an opening 13 which opens through both the inorganic substance bank layer 12a and organic substance bank layer 12b is formed above the transparent electrode 11.

Furthermore, the plane shape of this opening 13 is not particularly important and may comprise a circle, oval, square, or stripe. However, in the case of a square or the like, due to the surface tension of the ink composition, it is preferable to round out the corners thereof.

Subsequently, in the plasma treatment process, a region of ink affinity and an ink repellent region are formed on the surface of the bank member 12.

This plasma treatment process is divided into a pre-heating process, an ink affinity process for imparting ink-affinity to the entire surface, an ink repellent process for making the organic substance bank layer 12b ink repellent, and a cooling process.

In the pre-heating process, the substrate 10 including the bank member 12 is heated to a predetermined temperature. This heating is performed by means of installing a heater, for example, at a stage in which the substrate 10 is loaded within the plasma treatment chamber, and heating the substrate 10 to 70 to 80° C., for example, using this heater at the desired stage.

By means of performing this pre-heating process, even in the case when the plasma treatment is conducted continuously on a plurality of substrates, it is possible to achieve almost constant plasma treatment conditions from immediately after commencing the treatment to immediately prior to terminating the treatment. As a result, it is possible to impart a uniform affinity with respect to the composition ink of the bank portions 12 between substrates 10, which in turn allows for the manufacture of a display apparatus having a constant product quality.

In addition, the substrate 10 is pre-heated beforehand, and thus the processing time for the subsequent plasma treatment can also be shortened.

In the aforementioned process for imparting ink affinity, a plasma treatment ($O_2$ plasma treatment) is performed in which oxygen in the atmospheric air is used as the reactive gas. Specifically, the substrate 10 including the bank members 12 is placed onto a test stage within the interior of a heater, and oxygen in a plasma state is irradiated thereon.

This $O_2$ plasma treatment may be performed under the conditions of a plasma power of 100 to 800 kW, an oxygen gas flow of 50 to 100 cc/min, a substrate transport speed of 0.5 to 10 mm/sec, and a substrate temperature of 70 to 90° C.

Furthermore, the heating performed according to this test stage is conducted mainly to maintain the temperature of the pre-heated substrate 10.

By means of this $O_2$ plasma treatment, hydroxyl groups are introduced in the exposed surfaces of the transparent electrode 11 and inorganic substance bank layer 12a, and on the entire surface of the organic substance bank layer 12b, thereby imparting the aforementioned with ink affinity properties.

Subsequently, in the aforementioned process for imparting ink repellent properties, a plasma treatment ($CF_4$ plasma treatment) is performed in the atmospheric air wherein tetrafluoromethane (tetra-fluoro-carbon) is used as the reactive gas.

Specifically, the substrate 10 including the bank members 12 is placed onto a test stage within the interior of a heater, and tetrafluoromethane in a plasma state is irradiated thereon.

This $CF_4$ plasma treatment may be performed under the conditions of a plasma power of 100 to 800 kW, a tetrafluoromethane gas flow of 50 to 100 cc/min, a substrate transport speed of 0.5 to 10 mm/sec, and a substrate temperature of 70 to 90° C. Furthermore, the heating performed according to this test stage is conducted mainly to maintain the temperature of the pre-heated substrate 10, in the same manner as with the first plasma treatment chamber 52.

Furthermore, the reactive gas is not limited to only tetrafluoromethane, but other fluorocarbon gases may also be used.

According to this $CF_4$ plasma treatment, ink repellent properties are imparted by means of introducing fluorine groups into the organic substance bank layer, which displays an ink affinity by means of the previous process. Hydroxyl groups of the organic substances such as acrylic resin and polyimide resin forming the aforementioned organic substance bank layer 12b are substituted easily by the fluorine groups by means of irradiating a fluorocarbon in a plasma state so that they are imparted with the aforementioned ink repellent properties.

On the other hand, the exposed surfaces of the transparent electrode 11 and inorganic bank layer 12a are slightly affected by this $CF_4$ plasma treatment. However, the $CF_4$ plasma treatment does not affect on the affinity.

By cooling the substrate 10, which has been heated for the plasma treatment back, to room temperature or to a predetermined temperature (a temperature for executing the ink jet process) in the subsequent cooling process, it is possible to execute formation of the hole injection/transport layer at a constant temperature. As a result, it is possible to continuously discharge the ink droplets at a constant volume, at the time of discharging the composition ink containing the hole injection/transport layer material according to an ink jet method. In this manner, a uniform hole injection/transport layer can be formed.

According to the aforementioned plasma treatment process, by means of sequentially performing the aforementioned $O_2$ plasma treatment and $CF_4$ plasma treatment with respect to the organic substance bank layer 12a and inorganic bank layer 12b, comprising different materials, it is possible to easily provide both a region of ink affinity and an ink repellent region in bank member 12.

Subsequently, in the hole injection/transport layer formation process, an hole injection/transport layer 16 is formed by means of discharging an ink composition 15 containing the hole injection/transport layer material from an opening 13 above the aforementioned transparent electrode 11, and then drying and heat treating the aforementioned.

Furthermore, after forming the aforementioned hole injection/transport layer, it is preferable to perform processes in an inert gas environment, such as that of a nitrogen atmosphere and/or argon atmosphere without water and oxygen.

Figure 2:
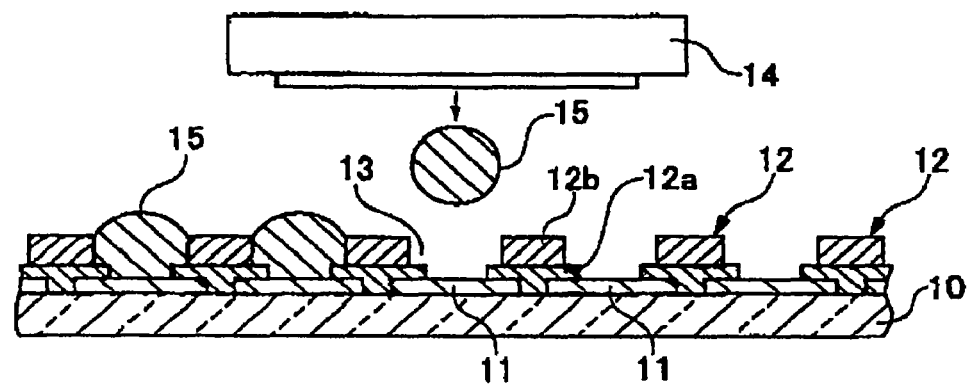
FIG. 2 is a cross sectional view showing a process of a manufacturing method for manufacturing an organic electro-luminescent device according to an embodiment of the present invention.

As shown in FIG. 2, an ink composition 15 containing the hole injection/transport layer material is first filled into an ink jet head 14, the discharge nozzle of which faces an opening 13. While mutually moving this ink jet head 14 and the substrate 10, the ink composition 15, the liquid amount per droplet of which is controlled, is then discharged onto the transparent electrode 11 from the aforementioned ink jet head 14.

As the ink composition 15 used here, for example, a mixture of a polythiophene derivative such as polyethylene dioxythiophene (PEDOT) or the like, and a polystyrene sulfonate (PSS), which has been dissolved in a polar solvent may be used. The aforementioned polar solvent may include, for example, isopropyl alcohol (IPA), normal butanol, γ-butyrolactone, N-methyl pyrolidone (NMP), 1,3-dimethyl-2-imidazolidone (DMI), derivatives thereof, and glycol ethers such as carbitol acetate, butylcarbitol acetate, and the like.

More concrete examples of the ink composition 15 may include a composition comprising 11.08% by weight of a PEDOT/PSS mixture (wherein the ratio of PEDOT to PSS is 1 to 20); 1.44% by weight of PSS; 10% by weight of IPA; 27.48% by weight of NMP; and 50% by weight of DMI. Furthermore, the viscosity of the ink composition is preferably 2 to 20 Ps, and more preferably approximately 7 to 10 cPs.

By means of using the aforementioned ink composition, it is possible to perform stable discharge of the ink composition from a discharge nozzle without plugging of the discharge nozzle of the ink jet head 14.

Moreover, with regard to the material comprising the hole injection/transport layer 16, the same material may be used for each light emitting layer of R, G, and B. Alternatively, these materials may also differ from each other as well.

The discharged ink composition 15 then spreads onto the transparent electrode 11 and the inorganic bank layer 12a of the opening 13, both of which have been imparted with ink affinity properties. In addition, even if the ink composition 15 falls out of the predetermined discharge position, and is discharged onto the organic substance bank layer 12b, this ink composition 15 falls away from the organic substance bank layer 12b and flows into an opening 13 without wetting the organic substance bank layer 12b.

The discharge amount of the ink composition 15 may be determined according to the size of the opening 13, thickness of the hole injection/transport layer, concentration of the hole injection/transport layer in the ink composition 15, and the like.

In addition, the discharge of the ink composition 15 to the opening 13 may be divided over several cycles instead of discharging all at once. In such a case, the discharge amount of the ink composition 15 may be identical each time, or alternatively may vary with each cycle. Furthermore, the ink composition is not necessarily discharged onto the same location within opening portions 13 every time, and the ink composition 15 may be discharged to different locations within opening portion 13.

Figure 3:
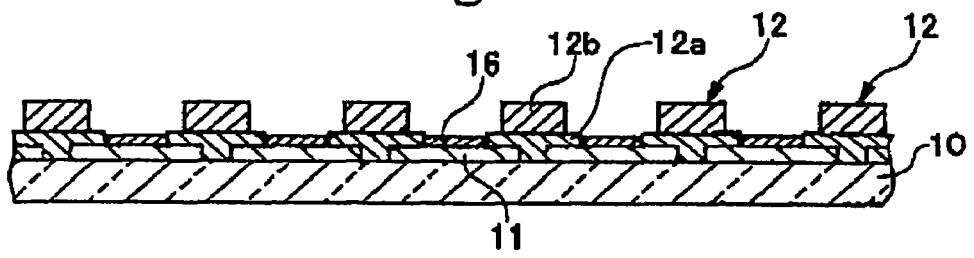
FIG. 3 is a cross sectional view showing a process of a manufacturing method for manufacturing an organic electro-luminescent device according to an embodiment of the present invention.

Subsequently, a hole injection/transport layer 16 is formed, as shown in FIG. 3, by means of drying the discharged ink composition 15, and evaporating the polar solvent contained in the ink composition 15.

The drying process, for example, may be performed at room temperature under a pressure of approximately 133.3 Pa (1 Torr) in nitrogen atmosphere. A pressure that is excessively low leads to clumping of the ink composition 15, and hence is not desirable. Furthermore, a small amount of the ink composition 15 remains on and adheres to the surrounding wall surface of the bank member 12. Thus, if the aforementioned drying temperature exceeds room temperature, the evaporation speed of the polar solvent is increased, which leads to an excessive amount of the ink composition 15 remaining on the aforementioned wall surface. Accordingly, the aforementioned drying process is preferably performed at a temperature not to exceed room temperature.

After the drying process, the polar solvent and water remaining in the hole injection/transport layer 16 are preferably removed by means of heat treating the aforementioned for approximately 10 minutes at 200° C. in nitrogen, or preferably in vacuum.

In the aforementioned hole injection/transport layer formation process, the discharged ink composition 15 blends into the exposed surface portions of the transparent electrode 11 and inorganic bank layer 12a, which exhibit ink affinity properties, while for the most part not adhering to the ink repellent, organic substance bank layer 12b. Therefore, even in the case when the ink composition 15 is mistakenly discharged onto the aforementioned organic substance bank layer 12b, this ink composition 15 falls away and flows onto the exposed surface portions of the transparent electrode 11 and inorganic bank layer 12a, both of which exhibits ink affinity properties. As a result, a hole injection/transport layer 16 can be reliably formed onto the aforementioned transparent electrode 11.

Subsequently, a surface reforming process is performed prior to conducting the light emitting layer forming process. In other words, in order to prevent the hole injection/transport layer 16 from being re-dissolved while forming the light emitting layer, a non-polar and insoluble solvent to the hole injection/transport layer 16 is used with respect to the hole injection/transport layer 16, as the solvent for the ink composition at the time of forming the light emitting layer.

However, on the other hand, the aforementioned hole injection/transport layer 16 has a low affinity with the aforementioned non-polar solvent. Thus, even when the ink composition of the light emitting layer comprising the non-polar solvent is discharged onto the aforementioned hole injection/transport layer 16, there exists a fear that the ink composition will be repelled by the hole injection/transport layer 16, which makes it impossible to adhere the light emitting layer with the hole injection/transport layer 16, or alternatively makes it impossible to form uniform coating of the light emitting layer.

Hence, in order to increase the surface affinity of the aforementioned hole injection/transport layer 16 with the aforementioned non-polar solvent, it is preferable to perform a surface reforming process prior to the formation of the light emitting layer.

In this surface reforming process, a solvent for use in surface reforming, which is identical or similar to the non-polar solvent of the ink composition used at the time of forming the light emitting layer, is coated onto the aforementioned hole injection/transport layer 16 by means of an ink jet method, spin coating method, or dip method, and dried thereon.

According to an ink jet method, the aforementioned coating is performed by means of filling a solvent for use in surface reforming into an ink jet head, and then discharging this surface reforming solvent onto the hole injection/transport layer 16, while moving this ink jet head and the substrate 10 to each other, with the discharge nozzle of the ink jet head facing the aforementioned hole injection/transport layer 16.

In addition, according to a spin coat method, a substrate 10 is, for example, loaded onto a stage, and a surface reforming solvent is added thereto in a dropwise manner from above. Subsequently, the substrate 10 is rotated to spread the surface reforming solvent over the entire hole injection/transport layer 16 on the substrate 10. Furthermore, although the surface reforming solvent is temporarily spread over the ink repellent organic substance bank layer 12b, this surface reforming solvent is blown aside by the centrifugal force of the aforementioned rotation, and hence ends up coating only the aforementioned hole injection/transport layer 16.

Furthermore, the coating according to a dip method involves immersing a substrate 10 in a surface reforming solvent, and following removal, spreading this surface reforming solvent over the entire hole injection/transport layer 16. In this case as well, the surface reforming solvent is temporarily spread over the ink repellent organic substance bank layer 12b, but falls away from the ink repellent organic substance bank layer 12b and removed from the surface reforming solvent. As a result, the surface reforming solvent ends up coating only the aforementioned hole injection/transport layer 16.

The surface reforming solvent used here may include compounds identical to the non-polar solvent of the ink composition, such as cyclohexylbenzene, dihydrobenzofuran, trimethylbenzene, tetramethylbenzene, and the surface reforming solvent such as toluene, xylene, and the like are preferable for the spin coat method and the dipping method.

In particular, when performing the aforementioned coating according to an ink jet method, dihydrobenzofuran, trimethylbenzene, tetramethylbenzene, cyclohexylenzene, a mixture of these compounds, especially the same solvent mixture used in the ink composition and the like are preferably used. In the case when performing the aforementioned coating according to a spin coating or dip method, toluene, xylene, and the like are preferably used.

With regard to the drying process, in the case when the coating has been performed according to an ink jet method, it is preferable to perform the aforementioned drying by means of loading the substrate 10 onto a hot plate and heating the aforementioned to a temperature of no greater than 200° C. in order to dry the surface reforming solvent. On the other hand, in the case when the coating has been performed according to a spin coating or dip method, the surface reforming solvent is preferably dried by means of either blowing nitrogen onto the substrate 10, or by generating an air flow onto the surface of the substrate 10 by rotating the aforementioned substrate.

Moreover, it is also possible to perform the coating of the surface reforming solvent after the drying process of the aforementioned hole injection/transport layer formation process, and then conduct the heat treating process of the hole injection/transport layer formation process after drying the coated surface reforming solvent.

By means of performing the aforementioned surface reforming process, the surface of the hole injection/transport layer 16 blends in easier with the non-polar solvent. In addition, by means of the subsequent processes, it is possible to uniformly coat the ink composition containing the light emitting layer material onto the aforementioned hole injection/transport layer 16.

Moreover, it is also possible to form an ultra thin hole transport layer onto the aforementioned hole injection/transport layer by means of forming an ink composition by dissolving a commonly used hole transport layer material, such as arylamine-type compound and the like, in the aforementioned surface reforming solvent. The resultant ink composition is then coated onto the hole injection/transport layer according to an ink jet method, and dried thereon.

Although the majority of this hole transport layer is dissolved into the light emitting layer coated in a subsequent process, a small amount remains as a thin layer between the hole injection/transport layer 16 and the light emitting layer. As a result, the energy barrier between the hole injection/transport layer 16 and the light emitting layer is reduced, which in turn allows for easy movement of the hole and improvement of light emitting efficiency.

In the subsequent light emitting layer formation process, the ink compositions 17a, 17b and 17c (not shown), each comprising a solute component, e.g., an organic electro-luminescent material or the like, and a solvent, are discharged according to the following sequence onto an hole injection/transport layer 16 which has undergone surface reformation. Drying and heat treatment of the aforementioned are then performed to sequentially form the light emitting layers 18a, 18b, and 18c.

The aforementioned organic electro-luminescent material may include fluorene-type high molecular weight derivatives such as shown in chemical formula 1 to chemical formula 5, shown later.

Examples of the organic electro-luminescent materials include (poly)-paraphenylene-vinylene derivatives, polyphenylene derivatives, polyfluorene derivatives, polyvinyl carbazol, polythiophene derivatives, perylene-type pigments, coumarin-type pigments, rhodamine-type pigments, as well as low molecular weight organic EL materials and large molecular weight EL materials that are soluble in other benzene derivatives. For example, it is possible use rublene, perylene, 9,10-diphenyl anthracene, tetraphenyl butadiene, Nile Red, coumarin 6, quinacridone, and the like.

Furthermore, in the chemical formula 1 to the chemical formula 5, n represents the degree of polymerization. In the chemical formula 1, n is in a range of 1,000 to 500,000, in the chemical formula 2, n is in a range of 1,000 to 500,000, in the chemical formula 3, n is in a range of 1,000 to 500,000; in the chemical formula 4, n ranges 1,000 to 500,000, and in the chemical formula 5, n ranges 1,000 to 500,00. In addition, in the chemical formula 5, R represents H, $CH_3$, $C_2H_5$ and so on.

[chemical formula 1]

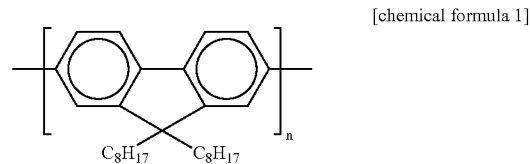

[chemical formula 2]

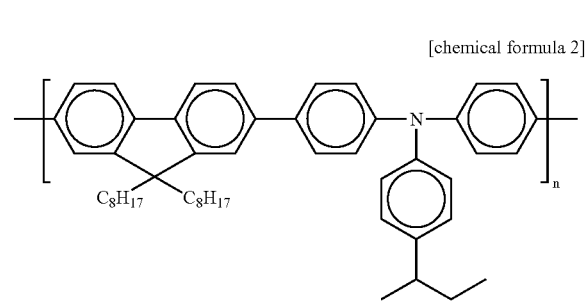

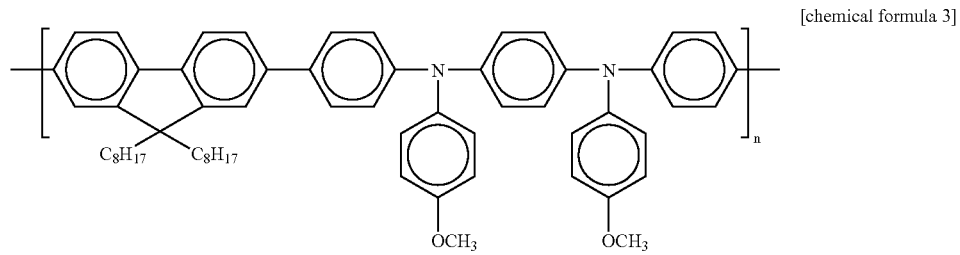

[chemical formula 3]

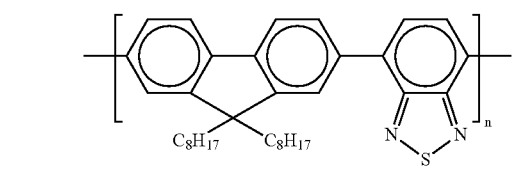

[chemical formula 4]

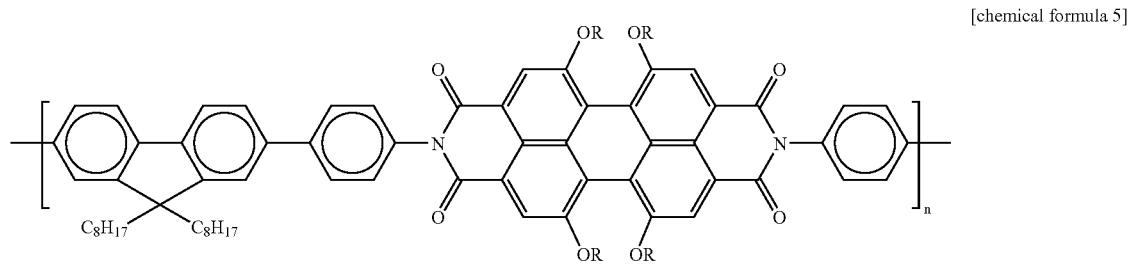

[chemical formula 5]

As the non-polar solvent, it is preferable to use a compound that is insoluble in the hole injection/transport layer 16, for example, cyclohexylbenzene, dihydrobenzofuran, trimethylbenzene, tetramethylbenzene, and the like.

By means of employing the non-polar solvent in the ink composition of the light emitting layer, it is possible to coat the ink composition without re-dissolving the hole injection/transport layer 16.

Furthermore, as the solute component, beside the organic electro-luminescent material, it is also possible to include an appropriate amount of a binder, such as a surface active agent, a thickener and the like.

Figure 4:
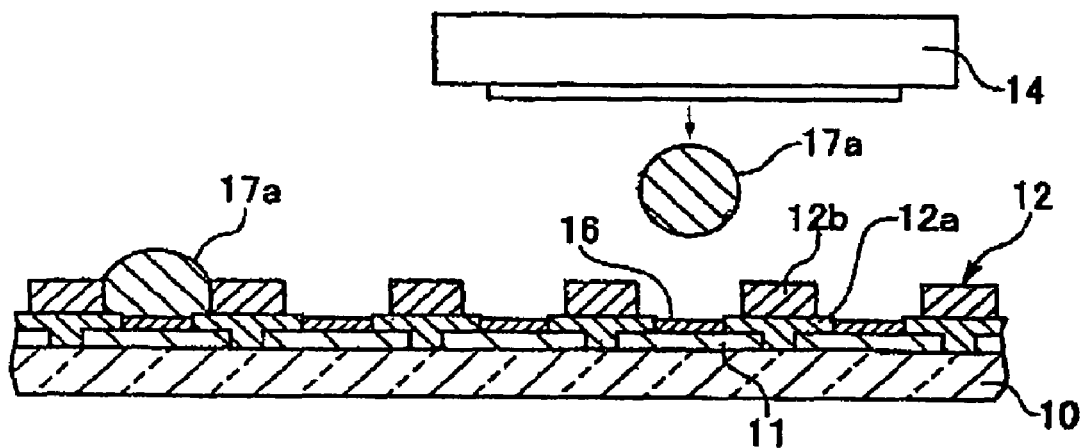
FIG. 4 is a cross sectional view showing a process of a manufacturing method for manufacturing an organic electro-luminescent device according to an embodiment of the present invention.

As shown in FIG. 4, an ink composition 17a is discharged onto an hole injection/transport layer 16 by means of filling the ink composition 17a into an ink jet head 14 and then discharging this ink composition, the liquid amount per droplet of which is controlled, from a discharge nozzle while moving both this ink jet head 14 and substrate 10 with respect to each other, with the discharge nozzle of the ink jet head 14 facing the aforementioned hole injection/transport layer 16.

In this case, the discharged ink composition 17a spreads out and blends into the hole injection/transport layer 16, without for the most part adhering to the organic substance bank layer 12b, which has previously undergone an ink repellent treatment. As a result, even when this ink composition 17a is mistakenly discharged onto the organic substance bank layer 12b, it falls away and flows onto the hole injection/ transport layer 16. In this manner, it is possible to form a layer of the ink composition 17a which is tightly adherent to the hole injection/transport layer 16.

The amount of the ink composition 17a is determined based on the thickness of the light emitting layer 18a to be formed, the concentration of the light emitting layer material within the ink composition, and the like.

In addition, the discharge of the ink composition 17a onto the hole injection/transport layer 16 may be performed with the dropwise addition of the ink composition 17a divided over several cycles instead of discharging all at once. In such a case, the droplet amount of the ink composition 17a may be identical each time, or alternatively may vary with each cycle. Furthermore, instead of being discharged to the same location on the hole injection/transport layer 16 each time, the ink composition 17a droplets may also be discharged arranging different locations within the hole injection/transport layer 16.

Figure 5:
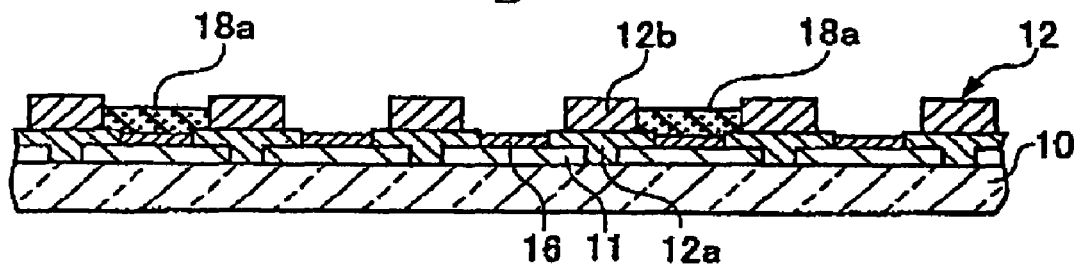
FIG. 5 is a cross sectional view showing a process of a manufacturing method for manufacturing an organic electro-luminescent device according to an embodiment of the present invention.

Subsequently, a light emitting layer 18a is formed, as shown in FIG. 5, by means of drying the discharged ink composition 17a, and evaporating the polar solvent contained in the ink composition 17a.

The drying process, for example, may be performed at room temperature under a pressure of approximately 133.3 Pa (1 Torr) in nitrogen atmosphere for 5-10 minutes, or by spraying nitrogen thereon at 40° C. for 5-10 minutes.

Other means for performing the aforementioned drying may include, for example, a far infrared irradiation method, a high-temperature nitrogen gas spraying method, and the like.

Figure 6:
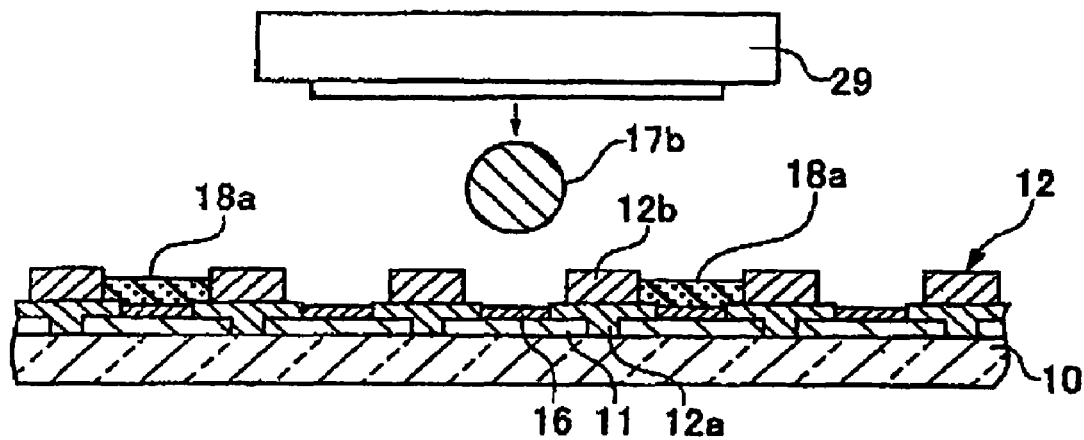
FIG. 6 is a cross sectional view showing a process of a manufacturing method for manufacturing an organic electro-luminescent device according to an embodiment of the present invention.
Figure 7:
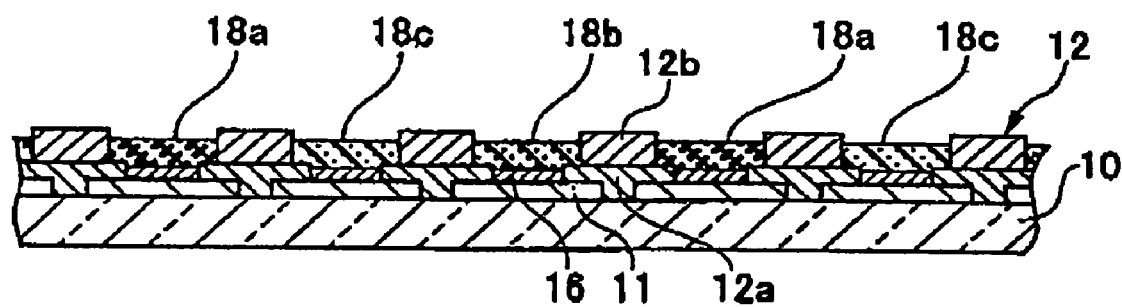
FIG. 7 is a cross sectional view showing a process of a manufacturing method for manufacturing an organic electro-luminescent device according to an embodiment of the present invention.

Subsequently, as shown in FIG. 6, a second light emitting layer 18b is formed by means of dropwise addition and drying of an ink composition 17b, in the same manner as with the aforementioned ink composition 17a. Thereafter, a third light emitting layer 18c is formed in a similar manner by means of dropwise addition and drying of an ink composition 17c, as shown in FIG. 7, to yield a substrate having three types of light emitting layers 18a, 18b, and 18c formed thereon.

Here, the formation sequence of the aforementioned three types of light emitting layers 18a, 18b, and 18c is determined in the following manner.

First, in the case when the number of organic electro-luminescent materials is different, the formation sequence starts with the layer comprising the fewest organic electro-luminescent materials. If a light emitting layer comprising a color having a large number of components is formed first, there exists the fear of phase separation due to re-dissolution of the initially formed light emitting layer, by the solvent vapor evaporated from the ink composition of a light emitting layer comprising a different color, which has been formed later.

In addition, in the case when the number of organic electro-luminescent materials comprising the respective ink compositions is identical, the aforementioned formation sequence starts with the ink composition comprising the organic electro-luminescent materials that are most difficult to phase separate. The degree of difficulty for phase separation may be determined by means of drying the ink compositions to be compared under identical drying conditions, and comparing the degree of phase separation of the resultant light emitting layers. At this time, the aforementioned "identical" drying conditions may include natural retention, drying by heating, and drying under reduced pressure, and the natural retention is preferably selected.

The degree of phase separation may be determined by the amount of light of a wavelength obtained at the time of complete phase separation that remains in the light emitting spectrum of the resultant light emitting layer. In addition, it is also possible to determine the degree of phase separation by the proportion of light of a wavelength resulting when complete phase separation does not occur, in the light emitting spectrum of the resultant light emitting layer.

In the cathode formation process, a cathode 19 is formed over the entire surfaces of the light emitting layers 18a, 18b, 18c, and organic substance bank layer 12b. This cathode 19 may be formed by laminating a plurality of materials.

For example, it is preferable to use a material such as Ca and Ba, whose work function is low, for forming a layer close to the light emitting layer, and sometimes it is more preferable to form a thin LiF layer as an underlayer, depending on the nature of the layer material formed on the light emitting layer. In addition, the cathode upper layer (sealing side) is preferably formed by materials such as an Al layer, an Ag layer, a Mg/Ag layer and the like, which have a larger work function than that of the lower layer. The thickness of the upper cathode layer is preferably within a range of 100 to 1,000 nm, and more preferably, within a range of 200 to 500 nm.

The aforementioned cathode layer is preferably formed by means of, for example, an evaporation method, spattering method, CVD method or the like. In particular, formation according to an evaporation method is preferable from the point of view of preventing the light emitting layers 18a, 18b, and 18c from being damaged by heat.

In addition, it is also possible to form the lithium fluoride layer only on the light emitting layers 18a, 18b, and 18c, or alternatively only on a specified light emitting layer. In such as case, the cathode upper layer formed from calcium comes into contact with the other light emitting layers.

In addition, it is also possible to provide a protective layer comprising SiO, $SiO_2$, SiN, or the like onto the cathode layer to prevent from oxidation.

Lastly, in the sealing process, a sealing layer 20 is formed by means of coating a sealing agent comprising a thermosetting resin or ultraviolet light cured resin onto the entire surface of the cathode 19. Furthermore, a substrate used for sealing (not shown in the Figures) is then laminated onto the sealing layer 20.

This sealing process is preferably conducted in the environment of an inactive gas, such as nitrogen, argon, helium, or the like. In the case when performing the aforementioned sealing process in air and a defect such as pin hole or the like is generated in the cathode layer, there exists the fear that water, oxygen, and the like will penetrate into the cathode 19 through the aforementioned defect, resulting in the undesirable oxidation of the cathode 19.

Figure 8:
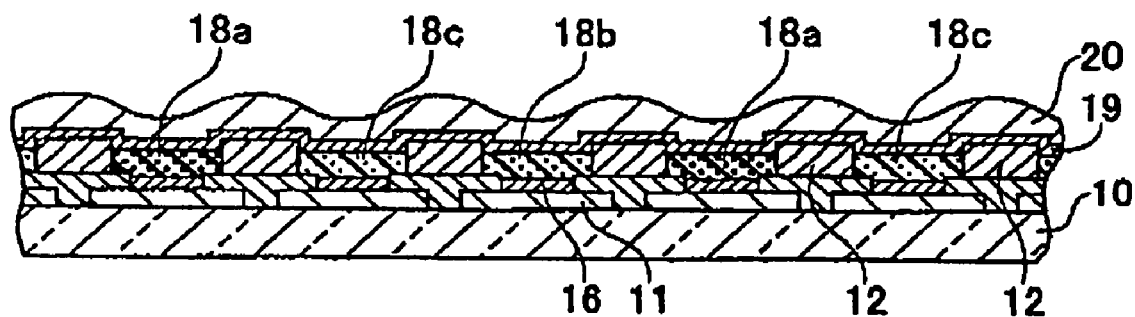
FIG. 8 is a cross sectional view showing a process of a manufacturing method for manufacturing an organic electro-luminescent device according to an embodiment of the present invention.

In this manner, an organic electro-luminescent device shown in FIG. 8 is obtained.

According to the present embodiment, the discharge formation of a layer of the ink composition comprising a greater number of organic materials is performed after that of the ink composition comprising fewer organic electro-luminescent materials. In addition, in the case when the ink compositions comprise the same number of organic electro-luminescent materials, this discharge formation of a layer is performed in a discharge sequence, starting with the ink composition comprising the organic electro-luminescent materials that are most difficult to phase separate. As a result, it is possible to prevent the phase separation occurring due to re-dissolution after the discharge formation of a layer. Accordingly, an organic electro-luminescent device having superior display properties can be reliably manufactured.

In the following, the electronic equipment comprising the organic electro-luminescent device manufactured according to the aforementioned embodiment will be described using concrete examples.

Figure 10A:
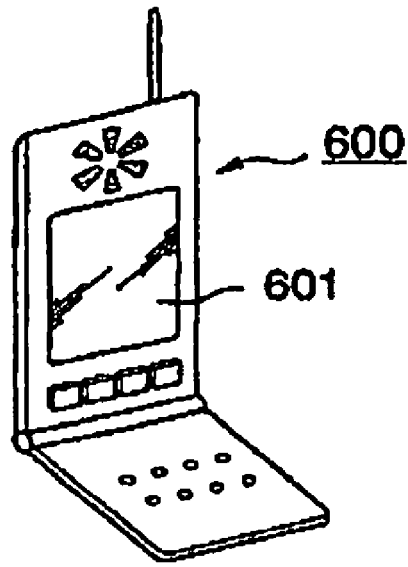
FIGS. 10A, 10B and 10C are perspective views showing electronic equipment equipped with an organic electro-luminescent device manufactured according to a manufacturing method of the present invention.

FIG. 10A is a perspective view showing an example of a portable telephone. In FIG. 10A, reference numeral 600 denotes a main body 600 of the portable telephone, and 601 denotes a display unit 601 comprising an organic electro-luminescent device are shown.

Figure 10B:
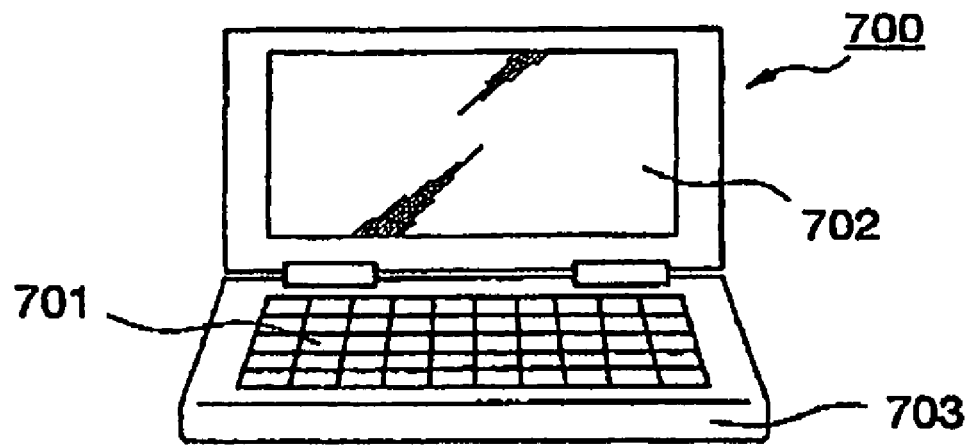

FIG. 10B is a perspective view showing an example of a portable information processing apparatus, e.g., word processor, personal computer, or the like. FIG. 10B shows an information processing apparatus 700, an input unit 701 such as a keyboard or the like, the main body 703 of the information processing apparatus, and an organic electro-luminescent device as a display unit 702.

Figure 10C:
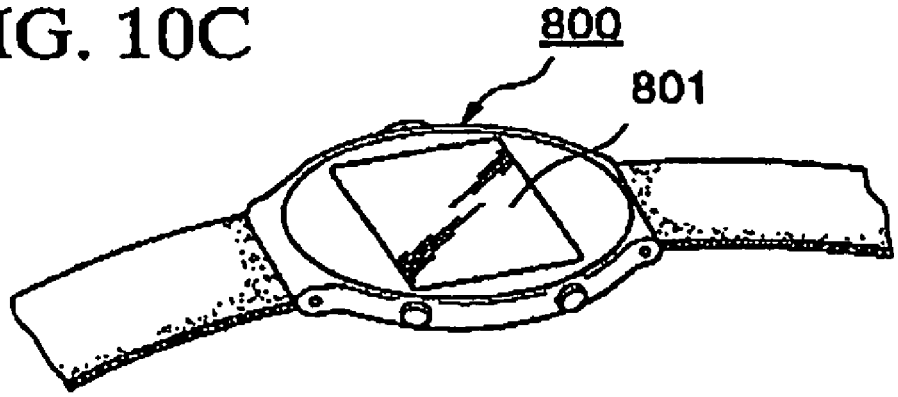

FIG. 10C is an oblique view showing an example of an electronic wristwatch. In FIG. 10C, the main body 800 of the watch, and an organic electro-luminescent device as a display unit 801 are shown.

According to the present embodiment, it is possible to provide electronic equipment that is equipped with a display apparatus possessing superior display properties.

EXAMPLES

The organic electro-luminescent devices of the Examples and Comparative Examples were manufactured according to the above-described embodiments. The concrete manufacturing conditions are described below. The conditions are common to all of the Examples and Comparative Example except the formation sequence for manufacturing the light emitting layer.

Bank Formation Process

A bank layer was formed so as to be opened on the transparent pixel electrode made of ITO. Since the transparent electrode was formed in a matrix form having a pitch of 70.5 micron meter, the bank layer was also formed in a matrix form having a pitch of 70.5 micron meter. The bank layer (bank)

was formed by laminating inorganic bank layers made of SiO$_2$ and organic substance bank layers made of polyimide. Each layer was formed on the etched layer formed by photolithographic technique. Circular openings were made for the bank layers and the opening for the organic substance bank layer was formed in a diameter of 28 micron meter and the opening for the inorganic bank layer was formed in a diameter of 44 micron meter. The organic substance bank layer was formed at a height of 2 micron meter and the inorganic bank layer was formed at a height of 150 nm.

Plasma Treatment Process

An O$_2$ plasma treatment was performed as a process for imparting ink affinity. This O$_2$ plasma treatment was conducted under the conditions of room temperature, atmospheric pressure, a power of 300 W, an electrode-substrate distance of 1 mm, an oxygen gas flow amount of 100 cc/min, a helium gas flow amount of 10 l/min, and a table transfer rate of 10 mm/s. Subsequently, a CF$_4$ plasma treatment was performed as a process for imparting ink repellent properties. This CF$_4$ plasma treatment was conducted under the conditions of a CF$_4$ gas flow amount of 100 cc/min, a helium gas flow amount of 10 l/min, and a table transfer rate of 3 mm/s.

Hole Injection/Transport Layer Formation Process

An ink composition (a mixture of "Baytron P" manufactured by Bayer AG and a polystyrene sulfonate) for use in an hole injection/transport layer shown in Table 1 was discharged from the head of an ink jet printer (MJ-9300 manufactured by Epson) at 15 pl to form a pattern coat. The solvent was then removed at room temperature under a vacuum (1 Torr) for 20 minutes. The same ink composition for use in an hole injection/transport layer was then discharged at 15 pl to form a pattern coat. After removing the solvent at room temperature under a vacuum (1 Torr) for 20 minutes, a heat treatment was performed in air atmosphere at 200° C. (on a hot plate) for 10 minutes to form an hole injection/transport layer.

TABLE 1

Ink Composition for Hole Injection/Transport Layer

| Composition | Material name | Composition (wt %) |
| --- | --- | --- |
| hole injection/transport layer materials | Bytron P | 11.08 |
| | Polystyrene sulfonate | 1.44 |
| Polar solvents | Isopropyl alcohol | 10 |
| | N-methyl pyrolidone | 27.48 |
| | 1,3-dimethyl-2-imidazolidone | 50 |

Surface Reforming Process 1,2,3,4-tetramethyl benzene was discharged from an ink jet printer (MJ-930C manufactured by Epson) to form a coat. Subsequently, the aforementioned was placed on a hot plate that was heated to a temperature below 200° C. and dried.

Light Emitting Layer Formation Process

The ink compositions shown in Tables 2 to 4 were prepared. Table 2 shows an ink composition (green) for a light emitting layer, Table 3 shows an ink composition (blue) for a light emitting layer; and Table 4 shows an ink composition (red) for a light emitting layer. Furthermore, compounds 1, 2, 4, and 5 in the Tables are respectively described above in Chemical Formula 1 to 5.

TABLE 2

Ink Composition (Green) for a Light emitting layer

| Composition | Material name | Composition weight |
| --- | --- | --- |
| Light emitting layer Materials | Compound 1 | 0.76 g |
| | Compound 2 | 0.20 g |
| | Compound 4 | 0.04 g |
| Solvent | 1,2,3,4-tetramethyl benzene | 100 ml |

TABLE 3

Ink Composition (Blue) for a Light emitting layer

| Composition | Material name | Composition weight |
| --- | --- | --- |
| Light emitting layer Material | Compound 1 | 1.00 g |
| Solvent | 1,2,3,4-tetramethyl benzene | 100 ml |

TABLE 4

Ink Composition (Red) for a Light emitting layer

| Composition | Material name | Composition weight |
| --- | --- | --- |
| Light emitting layer Materials | Compound 1 | 0.7 g |
| | Compound 2 | 0.2 g |
| | Compound 5 | 0.1 g |
| Solvent | 1,2,3,4-tetramethyl benzene | 100 ml |

Example 1

Initially, a blue light emitting layer was prepared by means of discharging the ink composition (blue) for a light emitting layer comprising a concentration of 1% (wt/vol) shown in Table 3, from an ink jet printer (MJ-930C manufactured by Epson) by 20 pl under an N$_2$ gas flow, and then drying under the conditions of 25° C. and 1 atm.

Subsequently, a green light emitting layer was prepared by means of discharging the ink composition (green) for a light emitting layer comprising a concentration of 1% (wt/vol) shown in Table 2, into a neighboring opening 13 at 20 pl under an N$_2$ gas flow, and then drying under the conditions of 25° C. and 1 atm.

Example 2

Initially, a blue light emitting layer was prepared by means of discharging the ink composition (blue) for a light emitting layer comprising a concentration of 1% (wt/vol) shown in Table 3, from an ink jet printer (MJ-930C manufactured by Epson) at 20 pl under an N$_2$ gas flow, and then drying under the conditions of 25° C. and 1 atm.

Subsequently, a red light emitting layer was prepared by means of discharging the ink composition (red) for a light emitting layer comprising a concentration of 1% (wt/vol) shown in Table 4, into a neighboring opening 13 at 20 pl under an N$_2$ gas flow, and then drying under the conditions of 25° C. and 1 atm.

Thereafter, a green light emitting layer was prepared by means of discharging the ink composition (green) for a light emitting layer comprising a concentration of 1% (wt/vol)

shown in Table 2, into a neighboring opening 13 at 20 pl under an N₂ gas flow, and then drying under the conditions of 25° C. and 1 atm.

Comparative Example 1

Initially, a green light emitting layer was prepared by means of discharging the ink composition (green) for a light emitting layer comprising a concentration of 1% (wt/vol) shown in Table 2, from an ink jet printer (MJ-930C manufactured by Epson) at 20 pl under an N₂ gas flow, and then drying under the conditions of 25° C. and 1 atm.

Subsequently, a blue light emitting layer was prepared by means of discharging the ink composition (blue) for a light emitting layer comprising a concentration of 1% (wt/vol) shown in Table 3, into a neighboring opening 13 at 20 pl under an N₂ gas flow, and then drying under the conditions of 25° C. and 1 atm.

Cathode Formation Process

After forming a LiF layer having a thickness of 2 nm by a vapor deposition method as the cathode layer, a calcium layer having a thickness of 20 nm was formed by a vapor deposition method. An aluminum layer of 200 nm was then formed as the cathode layer by a spattering method.

Sealing Process

A sealing layer was formed by means of coating a sealing agent comprising an epoxy resin onto the entire surface of the cathode. Furthermore, a substrate for use in sealing was laminated onto the aforementioned sealing layer to prepare the organic electro-luminescent device according to the Examples and Comparative Example.

Evaluation

Figure 9A:
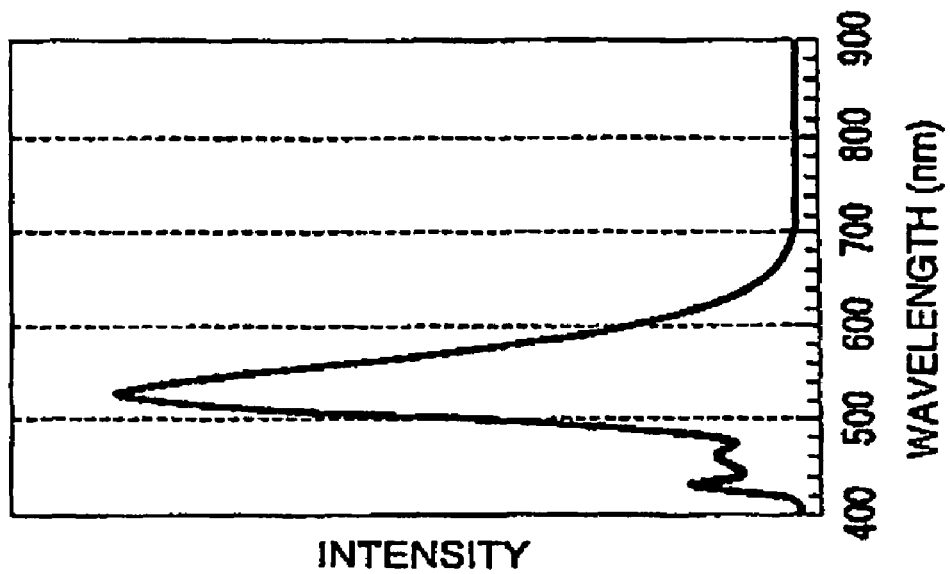
FIGS. 9A and 9B show light emitting spectra of a green light emitting layer according to an example and comparative example of the present invention.

The light emitting spectrums of the green light emitting layers of the organic electro-luminescent device according to the Comparative Example and Example 1 are shown in FIG. 9. As shown in FIG. 9A, a blue luminescent (430 nm) originated from the compound 1 remained in the green light emitting layer of the Comparative Example showed a spotty luminescent exhibiting color of light blue.

Figure 9B:
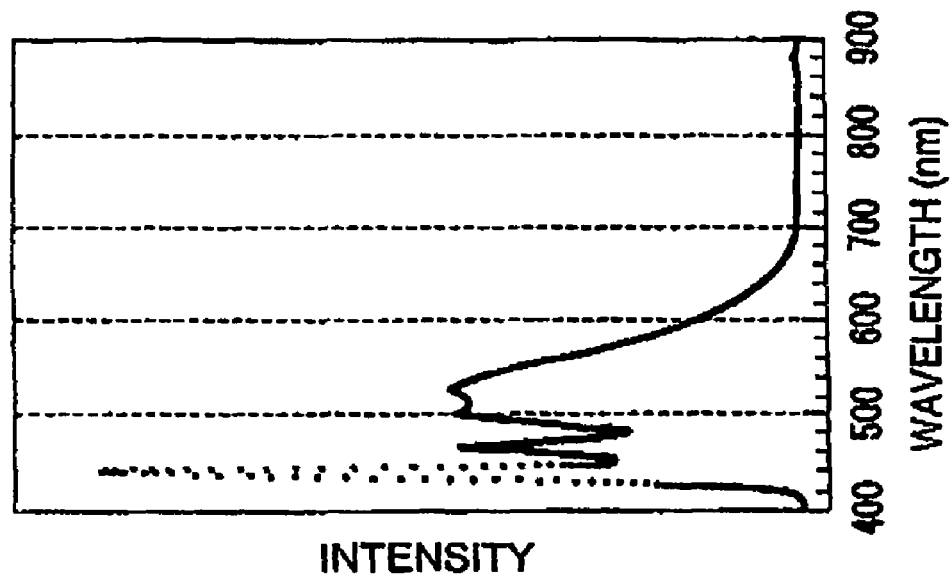

In contrast, as shown in FIG. 9B, the green light emitting layer of Example 1 displayed a green fluorescent luminescent (530 nm) having an approximately uniform spectrum.

In addition, the blue light emitting layers of the Comparative Example and Example 1 both displayed a uniform spectrum of blue luminescent (430 nm) originated by the compound 1.

Hence, the formation efficiency of forming the light emitting layers in the order starting with the layers having the fewest number of organic electro-luminescent materials was confirmed from the aforementioned.

In addition, the blue light emitting layer (430 nm), red light emitting layer (640 nm), and green light emitting layer (530 nm) of the organic electro-luminescent device according to Example 2 each showed a uniform spectrum.

Both the ink compositions of the (red) light emitting layer and (green) light emitting layer comprised three organic electro-luminescent materials, however, upon comparing the difficulty of phase separation of these ink compositions under the conditions of N₂ flow, the ink composition of the (red) light emitting layer was found to be more difficult to phase separate.

Hence, in the case when the ink compositions comprise an identical number of organic electro-luminescent materials, the efficiency of forming the light emitting layers in the order starting with the layer that is the most difficult to phase separate was confirmed from the aforementioned.

As described above, according to the method for manufacturing an organic electro-luminescent device of the present invention, it is possible to manufacture an organic electro-luminescent device having superior display properties in which phase separation due to re-dissolution after completion of forming layer can be prevented.

In addition, the organic electro-luminescent device according to the present invention comprises a uniform light emitting layer(s) and also exhibits superior display properties.

In addition, the present invention provides the electronic equipment which is capable of having superior display properties.

What is claimed is:

1. A method of manufacturing an electro-luminescent device, the method comprising:
    forming a first electrode;
    applying a first composition on or over the first electrode, the first composition including a first solvent;
    forming a hole injection layer by removing the first solvent from the first composition;
    applying a second composition on the hole injection layer, the second composition including a second solvent which has a lower polarity than the polarity of the first solvent, and
    forming a light emitting layer by removing the second solvent from the second composition.

2. A method of manufacturing an electro-luminescent device according to claim 1,
    forming an partition on the first electrode, the partition having opening portions on the first electrode;
    the partition including a first inorganic layer and a second organic layer that is formed on the first inorganic layer.

3. A method of manufacturing an electro-luminescent device according to claim 2, further including the step of:
    exposing the partition to fluorocarbon gas in a plasma state before applying the first composition.

4. A method of manufacturing an electro-luminescent device according to claim 3, further including the step of:
    exposing the partition to oxygen plasma before exposing the partition to fluorocarbon gas in a plasma state.

5. A method of manufacturing an electro-luminescent device according to claim 1,
    the polar solvent including at least one of isopropyl alcohol, normal butanol, γ-butyrolactone, N-methyl pyrolidone, 1,3-dimethyl-2-imidazol-idone, glycol ethers, carbitol acetate, and butylcarbitol acetate.

6. A method of manufacturing an electro-luminescent device according to claim 1,
    the non-polar solvent including at least one of cyclohexylbenzene, dihydrobenzofuran, trimethylbenzene, and tetramethylbenzene.

7. A method of manufacturing an electro-luminescent device according to claim 1, further including the step of:
    applying a surface reforming solvent onto the hole injection layer before applying the second composition on the hole injection layer.

8. A method of manufacturing an electro-luminescent device according to claim 7,
    the surface reforming solvent including at least one of dihydrobenzofuran, trimethylbenzene, tetarnethylbenzene, cyclohexylenzene, toluene, and xylene.

9. A method of manufacturing an electro-luminescent device according to claim 1, further comprising:
    forming a second electrode on or above the light-emitting layer, and
    forming on or above the second electrode a protective layer including at least one of Sio, Sio2 and SiN.

10. A method of manufacturing an electro-luminescent device according to claim 1, wherein a part of the hole transport layer is dissolved into the light emitting layer and the other part of the hole transport layer is formed between the hole injection layer and the light-emitting layer.

\* \* \* \* \*